United States Patent [19]
Abe et al.

[11] Patent Number: 5,703,499
[45] Date of Patent: Dec. 30, 1997

[54] ADDRESS BIT LATCHING INPUT CIRCUIT

[75] Inventors: Koichi Abe, Tokyo-to; Takashi Inui, Tsuchiura, both of Japan

[73] Assignee: Texas Instruments Incorporated, Dallas, Tex.

[21] Appl. No.: 630,312

[22] Filed: Apr. 10, 1996

[30] Foreign Application Priority Data

Apr. 10, 1995 [JP] Japan ................ 7-084172

[51] Int. Cl.[6] ........................... H03K 19/0175
[52] U.S. Cl. .................. 326/62; 326/86; 326/105; 365/230.08; 365/227
[58] Field of Search ............... 365/189.05, 230.06, 365/230.08, 227, 229; 326/21, 62, 86, 105

[56] References Cited

U.S. PATENT DOCUMENTS 5,319,262  6/1994  Cederbaum et al. .......... 326/21 X
5,402,387  3/1995  Hotta ..................... 365/189.05 X
5,469,402  11/1995 Yamauchi et al. ............ 365/230.08
5,586,081  12/1996 Mills et al. ................ 365/230.08
5,610,862  3/1997  Teels ..................... 365/189.05

*Primary Examiner*—David R. Hudspeth
*Attorney, Agent, or Firm*—Richard L. Donaldson; William B. Kempler

[57] ABSTRACT

An input circuit for a memory address bit operates at high operating speed. A PMOS transistor 112 is provided between a supply line for $½V_{CC}$ and a node N11. When not in operation, node N11 of input portion 11A is precharged not to the power supply voltage $V_{CC}$, but to $½V_{CC}$, a potential halfway between the power supply voltage $V_{CC}$ and 0 V. Another PMOS transistor 117 is provided between a PMOS transistor 111 and node N11 of the input stage to prevent leakage between $V_{CC}$ and $½V_{CC}$. As a result, an enable signal ENB goes to a high level, the circuit enters the operating state, address bit signal Ai is input, and the time needed to shift the level of node N11 to $V_{CC}$ or 0 V becomes short.

5 Claims, 2 Drawing Sheets

ADDRESS BIT LATCHING INPUT CIRCUIT

FIELD OF THE INVENTION

Our invention relates to an input circuit that can be applied to the addressing systems and the like of memory devices.

BACKGROUND OF THE INVENTION

An example of a conventional input circuit applied to the addressing system of a dynamic random access memory (DRAM) is shown in FIG. 4. This input circuit 10 is constructed by cascade-connecting an input portion 11 to a latch portion 12.

Input portion 11 has input terminals for an address bit signal Ai, an enable signal ENB, and a latch bar signal LTB0. A pair of p-channel MOS transistors 111, 112 (hereafter "PMOS transistors") are connected between a power supply voltage line $V_{CC}$ and a node N11. Two n-channel MOS transistors 113, 114 (NMOS transistors) are connected in series between node N11 and a reference voltage $V_{SS}$ (ground). A NAND gate 115 performs a NAND function on enable signal ENB and latch bar signal LTB0, and its output is inverted by a first inverter 116 connected to the output of NAND gate 115.

Address bit signal Ai is fed to the gates of transistors 111 and 114, and the output of inverter 116 is connected to the gates of transistors 112 and 113.

Latch portion 12 receives as inputs the potential at node N11 and the latch bar signal LTB0. A first clocked inverter 121 has its input terminal connected to node N11 and its control terminal connected to receive latch bar signal LTB0. A second clocked inverter 124 has its input terminal connected to receive an inverted version of the output of first clocked inverter 121 via an inverter 123 and a control terminal connected to receive an inverted version of latch bar signal LTB0 via an inverter 122. The output output of second clocked inverter 124 is connected to a node N12 on a line connecting the output of first clocked inverter 121 to the input of inverter 123.

A NOR circuit 125 has inputs connected to perform the NAND function on latch bar signal LTB0 and the signal of node N12. An inverted version of the output of NOR circuit 125 is provided to an output terminal for an external circuit (not shown) via an inverter 126.

As shown in the timing diagram of FIG. 5, when this conventional circuit is not in operation (during standby), the enable signal ENB), which is an internal signal, is at a low level (LOW), and latch bar signal LTB0, which is also an internal signal, is at a high level $V_{CC}$.

As a result, the output of the NAND gate 115 goes HIGH, and a LOW output signal S116 from inverter 116 is input to the gates of transistors 112 and 113 of input portion 11. In this way, PMOS transistor 112 is kept in a conducting state, and NMOS transistor 113 is kept in a nonconducting state. This effectively blocks the input signal Ai from reaching node N11 because node N11 is latched at the $V_{CC}$ level.

At this time, because latch bar signal LTB0 is HIGH, clocked inverter 121 of latch portion 12 is in an activated state and clocked inverter 124 is in an inactive state.

Next, the operating state begins when enable signal ENB switches from LOW to HIGH. The output of the NAND gate 115 goes LOW, and the HIGH output signal S116 from inverter 116 is input to the gates of transistors 112 and 113. NMOS transistor 113 then switches to the conducting state, and PMOS transistor 112 to the nonconducting state.

As a result, by responding to the input level of address bit signal Ai, PMOS transistor 111 and the NMOS transistor 114 of the input stage complementarily enter conducting and nonconducting states. In other words, a signal corresponding to the input signal Ai appears at node N11 of input portion 11 and is transmitted to node N12 of latch portion 12 via clocked inverter 121.

The signal transmitted to node N12 is inverted by inverter 123 and input to clocked inverter 124. Then, a prescribed time after the signal Ai was input to input portion 11, latch bar signal LTB0 switches from HIGH to LOW at the timing for input to inverter 124 of latch portion 12.

As a result, clocked inverter 121 enters the inactive state and clocked inverter 124 enters the active state; the input address signal is stably latched and output to an external circuit (not shown) via NOR circuit 125 and its inverter 126.

After latch bar signal LTB0 switches to LOW, input signal Ai is blocked and node N11 is precharged at the $V_{CC}$ level. However, as shown in FIG. 5, because during precharging node N11 rises to the high power supply level $V_{CC}$, during the input of a high-level signal Ai, time is required before the voltage level at node N11 can shift from $V_{CC}$ to $V_{SS}$ (ground), slowing the circuit's operating speed.

When the level of ViH is low, the operating speed of node N11 becomes even slower, the data is latched before the level of node N11 drops, and the $ViH_{min}$, which is not a problem in the case of DC, deteriorates in the case of AC.

Our invention was made taking the above information into account, and its purpose is to offer an input circuit with a high operating speed.

SUMMARY OF INVENTION

To achieve the objects, the input circuit of our invention selectively connects an internal node to either a first power supply potential or a second power supply potential based on the input signal, and outputs the signal of the pertinent node that has been shifted to the first or second power supply potential. When not in operation, our circuit holds the internal node at a potential approximately midway between the first and second power supply potentials.

During standby the internal node is recharged to a potential approximately midway between the first and second power supply potentials. Therefore, based on the signal input during operation, the level of the node that is electrically connected to the first or second power supply potential is shifted in a short period of time to the first or second power supply potential.

Also, the signal of the node that is virtually shifted to the first or second power supply potential is latched and output to the circuit of the next stage.

DETAILED DESCRIPTION

Figure 1:
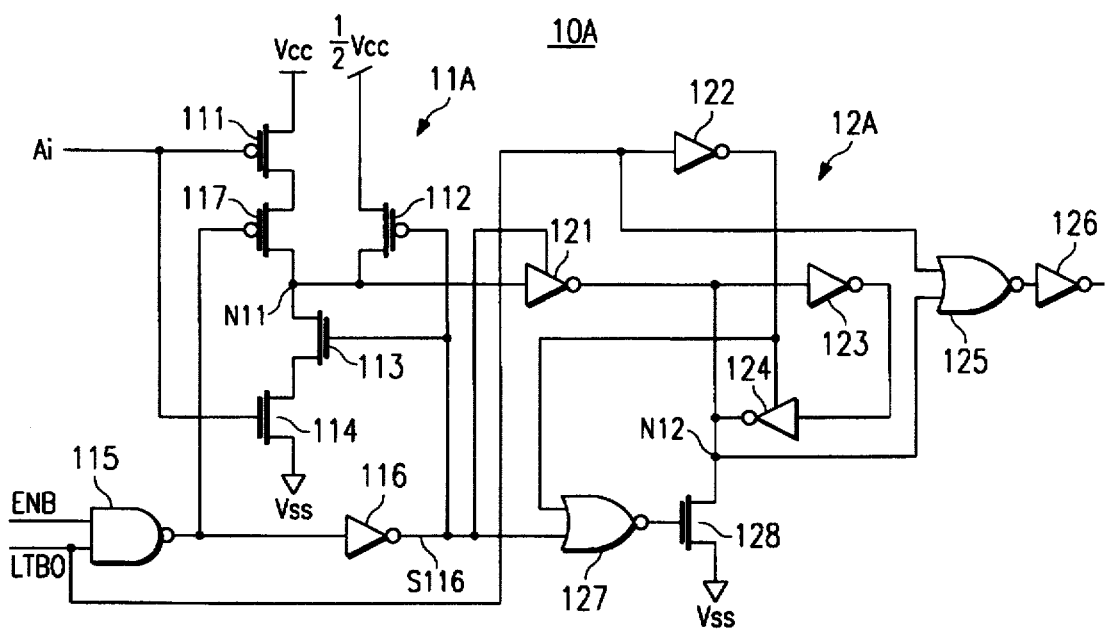
FIG. 1 is a block diagram of a first embodiment of an input circuit according to our invention.
Figure 4:
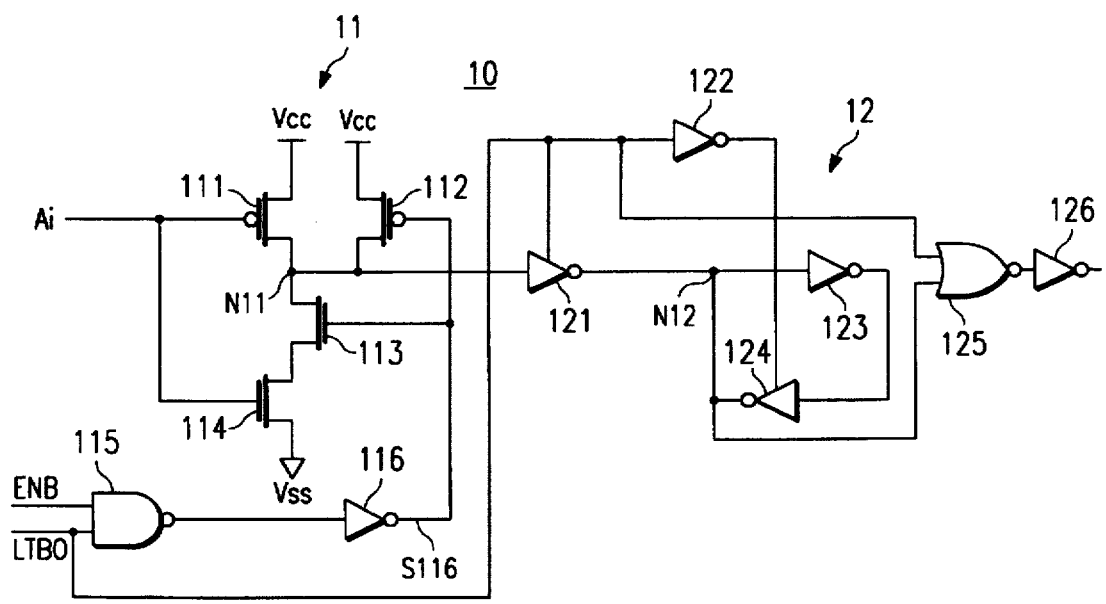
FIG. 4 is a circuit diagram of a conventional input circuit.

FIG. 1 shows a first embodiment according to our invention of an input circuit for an addressing system for a DRAM device, in which the components that are the same as those in the conventional circuit of FIG. 4 are indicated by the same reference numerals.

An input portion 11A has two PMOS transistors 111,117 connected in series between a power supply voltage $V_{CC}$ and a node N11. Another PMOS transistor 112 is connected between a power supply voltage $½V_{CC}$ (for example, 1.65 V if supply voltage $V_{CC}$ is 3.3 V) and node N11. Two NMOS transistors 113,114 are connected in series between node N11 and a reference potential $V_{SS}$ (ground). A NAND gate 115 performs a NAND function on an enable signal ENB and a latch bar signal LTB0, and its output is inverted by an inverter into a signal S116.

An input terminal for an address bit signal Ai is connected to the gates of PMOS transistor 111 and NMOS transistor 114. The gate of PMOS transistor 117 is connected to the output of NAND gate 115. The output of inverter 116 is connected to the gated of transistord 112 and 113.

When not in operation (in standby), input portion 11A only precharges node N11 to $½V_{CC}$, which is halfway between the power supply voltage $V_{CC}$ and reference voltage $V_{SS}$. Also PMOS transistor 117 is provided between the PMOS transistor 111 and node N11 to prevent leakage between $V_{CC}$ and $½V_{CC}$.

The input of latch portion 12A is connected to node N11 of input portion 11A, and has a first clocked inverter 121, the control terminal of which is connected to the output line of inverter 116. An inverter 123 has its input connected to receive the output of clocked inverter 121. A second clocked inverter 124 has its input connected to the output of inverter 123 and its control terminal connected to the inverse of latch bar signal LTB0 via an inverter 122. The output of clocked inverter 124 is connected to a node N12 on a line between of the output of clocked inverter 121 and the input of inverter 123.

A NOR circuit 125 has inputs connected to perform the NAND function on latch bar signal LTB0 and the signal of node N12. An inverted version of the output of a first NOR circuit 125 is provided to an output terminal for an external circuit (not shown) via an inverter 126.

A second NOR circuit 127 has inputs connected to perform the NOR function on the outputs of inverters 122 and 116 of input portion 11A. A NMOS transistor 128 is connected between node N12 and the reference potential $V_{SS}$, and its gate is connected to the output of NOR circuit 127.

In contrast to the circuit of FIG. 4, our clocked inverter 121 is not controlled by the latch bar signal LTB0, but instead by signal S116 that controls the input stage of input portion 12A. Also, we provide NOR circuit 127 and NMOS transistor 128 to prevent node N12 from floating.

Figures 2, 5:
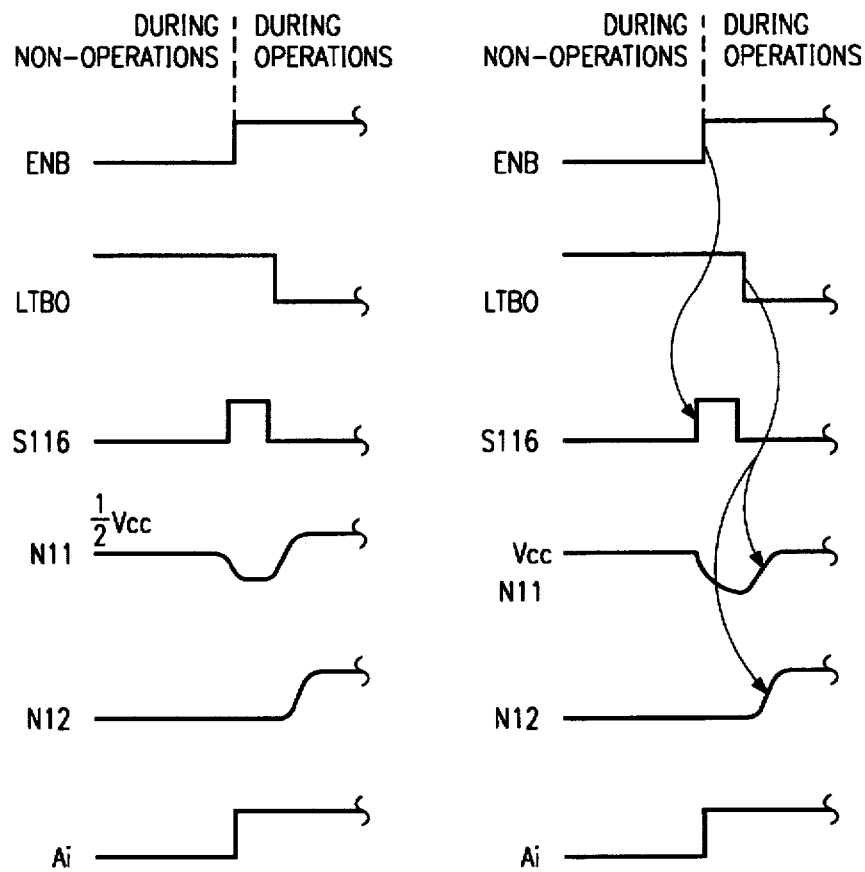
FIG. 2 is a timing diagram for the circuit of FIG. 1.
FIG. 5 is a timing diagram explaining the operation of the circuit of FIG. 4.

Next, the operation of our improved circuit will be explained with reference to the timing diagram of FIG. 2.

When not in operation (during standby), the enable signal ENB, an internal signal, is LOW (ground level), and the latch bar signal LTB0, also an internal signal, is HIGH ($V_{CC}$). Therefore, the HIGH output of NAND gate 115 is input to the gate of PMOS transistor 117, putting it in the non-conductive state. The LOW output signal S116 of inverter 116 input to the gate of PMOS transistor 112 puts it in the conductive state, but the LOW S116 signal to the gate of NMOS transistor 113 puts it in the non-conductive state. Therefore, the input address bit signal Ai is blocked, and transistor 112 precharges node N11 to the $½V_{CC}$ level.

At this time, because signal S116 is LOW, first clocked inverter 121 of latch portion 12A is in the inactive state.

Because latch bar signal LTB0 is HIGH, the LOW output of inverter 122 also keeps second clocked inverter 124 in the inactivated state.

Also, because signal S116 and the output of inverter 122 are both LOW, the output of NOR circuit 127 is HIGH, which keep NMOS transistor 128 in the conducting state. As a result, node N12 is pulled down to the ground level, preventing it from floating.

Next, the operating state begins when the enable signal ENB switches from LOW to HIGH. The output of NAND gate 115 switches to LOW, and PMOS transistor 117 switches to the conducting state. Also, a HIGH signal S116 is input to the gates of PMOS transistor 112 and NMOS transistor 113. Thus, PMOS transister 112 switches to the nonconducting state, and NMOS transistor 113 switches to the conducting state.

When the output of inverter 116 switches to HIGH, the clocked inverter 121 of latch portion 12A is put in the activated state. As a result, by responding to the input level of input address bit signal Ai, the PMOS transistor 111 and the NMOS transistor 114 of the input stage complementarily enter the conducting and nonconducting states. In other words, a signal responsive to the input signal Ai appears at node N11 and is transmitted to node N12 of the latch portion 12A via clocked inverter 121.

The signal transmitted to node N12 is inverted by inverter 123 and input to inverter 124. Then, a prescribed time after the signal Ai is input to input portion 11A, the latch bar signal LTB0 is switched from HIGH to LOW at the timing of input to inverter 124 of latch portion 12.

As a result, clocked inverter 121 enters the inactive state and clocked inverter 124 enters the active state.

At this time, because the outputs of inverter 116 and inverter 122 are HIGH, the output of NOR circuit 127 switches to LOW, making NMOS transistor 128 switch to the nonconducting state.

In latch portion 12A, the input address signal is stably latched, and the latched signal is output to an external circuit, (not shown) via NOR circuit 125 and inverter 126.

After latch bar signal LTB0 has switched to the low level, the input of address bit signal Ai is blocked at input portion 11A, and node N11 is precharged to the $½V_{CC}$ level.

As explained above, according to this embodiment, PMOS transistor 112 is provided between the supply line for $½V_{CC}$ and node N11, and when not in operation, node N11 of input portion 11A is not at the power supply voltage $V_{CC}$, but is precharged to $½V_{CC}$, which is a potential halfway between the power supply voltage $V_{CC}$ and 0 V, and also, to prevent leakage between $V_{CC}$ and $½V_{CC}$, since PMOS transistor 117 is provided between PMOS transistor 111 and node N11 of the input stage, when the enable signal ENB goes to the high level and enters the operating state, the input of signal Ai starts, and the time needed to shift the level of node N11 to $V_{CC}$ or 0 V becomes short. In other words, without making any major change in the circuit, an increase in circuit speed is realized, data being latched before the level of node N11 drops can be prevented, and $ViH_{min}$ can be improved in the case of AC.

In this embodiment, node N11 was constructed to be precharged when not in operation to ½ the power supply voltage $V_{CC}$, but the invention is not limited to this.

Figure 3:
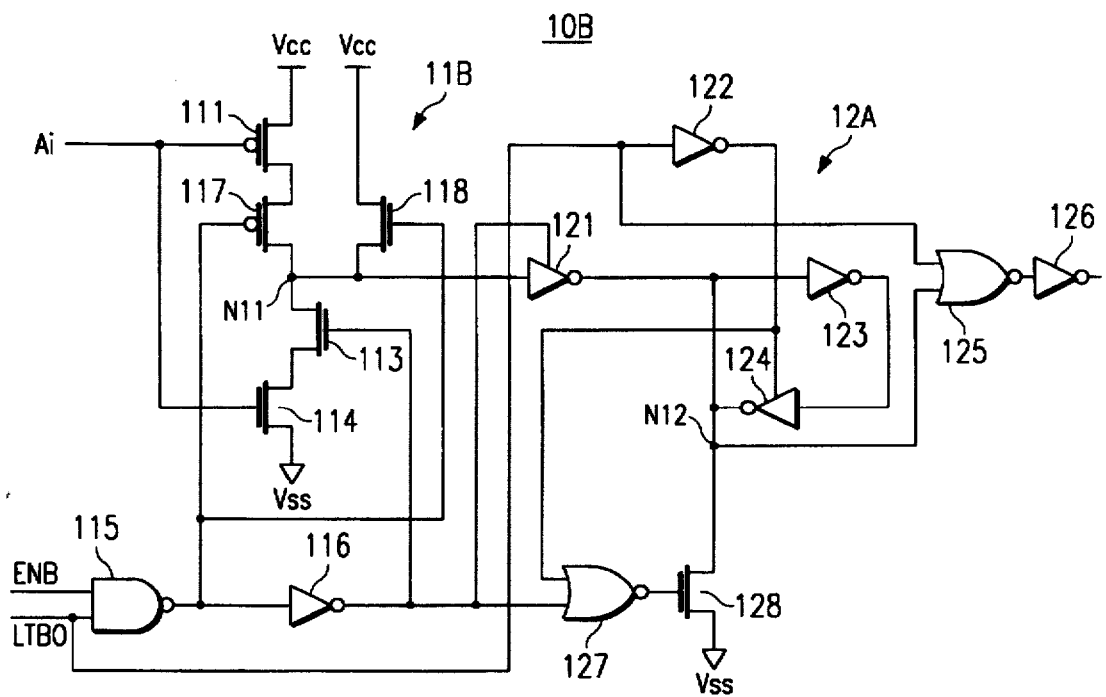
FIG. 3 is a circuit diagram of a second embodiment of an input circuit according to our invention.

For example, as shown in FIG. 3, at input portion 11B, instead of providing the PMOS transistor 112 between the supply line for $½V_{CC}$ and node N11, it can be constructed so as to provide a voltage dropping circuit that connects the NMOS transistor 118 between the supply line for the power supply voltage $V_{CC}$ in node N11, and when not in operation, causing the power supply voltage $V_{CC}$ to drop about 1 V and supplying it to node N11.

In this case, the gate of NMOS transistor 118 is connected to the output of NOR circuit 115.

Even in this type of construction, there is the advantage that the operating speed can be increased in the same manner as the effect. Furthermore, even with a construction wherein, instead of the NMOS transistor 118, a voltage dropping circuit that is constructed of at least one diode is connected between the power supply voltage $V_{CC}$ and node N11, it is probably clear to a person skilled in the art that the same effects can be obtained as with the described embodiments.

As explained above, according to our invention, an input circuit with a high operating speed can be realized.

In the FIGS., 10A and 10B represent an input circuit, 11A and 11B an input portion, 111, 112 and 117 a PMOS transistor, 113, 114 and 118 a NMOS transistor, 115 a NAND gate, 116 an inverter, N11 a node, 12A a latch portion, 121 and 124 a clocked inverter, 122, 123 and 126 an inverter, 125 and 127 a NOR circuit, and 128 a NMOS transistor.

We claim:

1. An address bit input circuit comprising:

first, second, and third input terminals for respectively receiving an input address bit signal having FIRST and SECOND levels, an enable signal having LOW and HIGH levels, and a latch bar signal;

first, second, and ground power supply terminals for respectively receiving first, second, and ground power supply potentials, the second power supply potential being between the first power supply potential and ground;

an internal node having an internal node potential;

an input switching circuit responsive to the address bit signal, enable signal, and the latch bar signal for selectively (i) coupling the internal node to the first input terminal when the enable signal is HIGH so the internal node potential responds to the input address bit signal, and (ii) coupling the internal node to the second power supply terminal when the enable signal is LOW;

an output terminal; and a latching circuit coupled to the enable signal, latch bar signal, internal node potential, and output terminal for selectively generating at the output terminal a (i) a latched address output signal responsive to the internal node potential when the enable signal is HIGH and (ii) a standby output signal when the enable signal is LOW.

2. The circuit of claim 1 wherein the second power supply potential is half of the first power supply potential.

3. The circuit of claim 1 wherein when the enable signal is HIGH the latching circuit generates (i) a latched address output signal at the ground power supply potential when the input address bit signal is at the FIRST level and (ii) a latched address output signal at the first power supply potential when the input address bit signal is at the SECOND level.

4. The circuit of claim 3 wherein the second power supply potential is half of the first power supply potential.

5. The circuit of claim 1 wherein the input switching circuit comprises two series-connected switching transistors coupling the internal node to the first power supply terminal and a single switching transistor coupling the internal node to the second power supply terminal.

* * * * *